(12) United States Patent
Yasunami et al.

(10) Patent No.: US 7,105,273 B2
(45) Date of Patent: *Sep. 12, 2006

(54) POSITIVE RESIST COMPOSITION

(75) Inventors: Shoichiro Yasunami, Shizuoka (JP); Hyou Takahashi, Shizuoka (JP); Kazuyoshi Mizutani, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 71 days.

This patent is subject to a terminal disclaimer.

(21) Appl. No.: 10/634,954

(22) Filed: Aug. 6, 2003

(65) Prior Publication Data
US 2004/0043323 A1   Mar. 4, 2004

(30) Foreign Application Priority Data
Aug. 8, 2002  (JP) ............ P. 2002-231477

(51) Int. Cl.
*G03F 7/04* (2006.01)
(52) U.S. Cl. ............ 430/270.1; 430/905; 430/910
(58) Field of Classification Search ............ 430/270.1, 430/905, 910; 403/905
See application file for complete search history.

(56) References Cited

U.S. PATENT DOCUMENTS

| 6,692,884 | B1 * | 2/2004 | Fujimori et al. ............ 430/170 |
| 6,733,951 | B1 * | 5/2004 | Kodama ............ 430/270.1 |
| 2002/0182535 | A1 * | 12/2002 | Maeda et al. ............ 430/270.1 |
| 2003/0224288 | A1 * | 12/2003 | Kodama ............ 430/270.1 |
| 2005/0019689 | A1 * | 1/2005 | Kodama ............ 430/270.1 |
| 2005/0142484 | A1 * | 6/2005 | Watanabe et al. ............ 430/270.1 |

FOREIGN PATENT DOCUMENTS

| JP | 2-19847 | 1/1990 |
| JP | 4-211258 | 8/1992 |
| JP | 4-219757 | 8/1992 |
| JP | 2000-292917 | 10/2000 |
| JP | 2001-294570 | 10/2001 |

* cited by examiner

*Primary Examiner*—John S. Chu
(74) *Attorney, Agent, or Firm*—Sughrue Mion, PLLC

(57) ABSTRACT

A positive resist composition of the present invention achieving significant performance improvements in high energy-beam lithography, which comprises a phenolic polymer having a property of being insoluble or hardly soluble in an aqueous alkali solution and becoming soluble in an aqueous alkali solution by the action of an acid, in which the phenolic polymer includes a repeating unit containing at least one selected from the group consisting of an acetal-protected phenolic hydroxyl group, a ketal-protected phenolic hydroxyl group, a tertiary ester-protected carboxyl group and a tetrahydropyranyl-protected carboxyl group; and a compound having a phenacylsulfonium structure and capable of generating an acid upon irradiation with one of actinic rays and radiation.

6 Claims, No Drawings

POSITIVE RESIST COMPOSITION

FIELD OF THE INVENTION

The present invention relates to a positive resist composition used suitably in ultramicro-lithographic processes for manufacturing VLSI chips and high-capacity microchips, and other photofabrication processes. More specifically, the invention relates to a positive resist composition capable of forming finer patterns by the use of high-energy beams (e.g., KrF excimer laser, ArF excimer laser, electron beams, X-rays, ionic beams). In particular, the invention is concerned with a positive resist composition suitable for use in KrF excimer laser- or electron beam-utilized photolithographic processing of semiconductor devices.

BACKGROUND OF THE INVENTION

Hitherto, minute patterning by lithography using photoresist compositions has been performed in processes of s manufacturing semiconductor devices, such as ICs and LSI. Recent growing need for larger packing densities of integrated circuits has come to entail super minute patterning in the submicron or quatermicron region. In response to such a requirement, the light sources used in photolithography are showing a tendency to have shorter wavelengths. Actually, the light for exposure use have been changed from g-ray to i-ray, and further to KrF excimer laser beam. And nowadays the development of lithographic processes using not only excimer laser beams but also electron beams and X-rays is proceeding.

Electron-beam lithography is placed as a next-generation patterning technology or a generation-after-next patterning technology, and it is desired to develop positive resist highly sensitive to electron beams and capable of forming highly resolved patterns. Increasing sensitivity in particular is a very important problem in pursuing reduction of wafer processing time. As to the electron beam resist, however, pursuit of increased sensitivity results in not only lowering of resolution but also deterioration of line edge roughness. Therefore, it is strongly desired to develop resist compositions satisfying such quality requirements at the same time. The term "line edge roughness" as used herein means rough appearance the pattern-substrate interface edge has when resist patterns are viewed from right above, wherein the roughness of the pattern-substrate interface edge arises from irregular fluctuation in a direction perpendicular to the line direction resulting from resist properties. Transfer of this roughness occurs in the etching process using the resist as a mask and gives rise to deterioration in electric properties and decrease in yield rate. Therefore, improvement of line edge roughness is a very important problem, especially in the superfine region of 0.25 μm or below. High sensitivity bears a trade-off relation to high resolution, pattern profiles of good quality and satisfactory line edge roughness, and so how to satisfy these properties at the same time is a very important problem.

And also in the lithography using excimer laser beams with short wavelengths, such as KrF excimer laser, as exposure source, formation of fine patterns in the region of 0.20 μm or below is targeted for. As in the case of electron beam lithography, there is a trade-off relation between properties including sensitivity, resolution, pattern-profile quality and line edge roughness, and so it is intensely desired to develop resist compositions satisfying those quality requirements at the same time.

As resist suitable for lithographic processes using electron beams and KrF excimer laser, acid catalyst-utilized chemical amplification resist has been mainly used from a sensitivity-oriented point of view. With respect to the positive resist, chemical amplification resist compositions containing as main components a phenolic polymer having a property of being insoluble or hardly soluble in an aqueous alkali solution but becoming soluble in an aqueous alkali solution by undergoing the action of an acid (hereinafter referred to as a phenolic acid-decomposable resin) and an acid generator have been used effectively.

Such positive resist has undergone continual performance improvements made with attention to its constituent polymer and acid generator. For instance, JP-A-2-19847 discloses the resist composition containing the poly(p-hydroxystyrene) whose phenolic hydroxyl groups are totally or partly protected by tetrahydropyranyl groups, and JP-A-4-219757 discloses the resist composition containing the poly (p-hydroxystyrene) in which 20 to 70% of the phenolic hydroxyl groups are replaced by acetal groups.

As to improvements from the standpoint of an acid generator, JP-A-2000-292917 discloses the combination of an acid-decomposable polymer containing carboxyl groups protected by acid-decomposable groups, an acid generator of a specified phenacyl structure and a triphenylsulfonium salt, JP-A-2001-294570 discloses application of the phenacylsulfonium salt of a specified structure to positive resist, and JP-A-4-211258 discloses the combination of a specified acid-decomposable phenolic resin and a specified phenacylsulfonium salt.

However, it is the present condition that any of the aforementioned combinations and arts cannot satisfy all of high sensitivity, high resolution, pattern profile of good quality and satisfactory line edge roughness at the same time.

SUMMARY OF THE INVENTION

The invention is aimed at solution of the technological problems of performance improvements in minute patterning of semiconductor elements by use of high-energy beams. More specifically, an object of the invention is to provide a positive resist composition capable of ensuring all of high sensitivity, high resolution, pattern profile of good quality and satisfactory line edge roughness when microlithographic processes using KrF excimer laser, X-rays, electron beams and ionic beams are applied thereto.

As a result of our intensive studies, it has been found to our surprise that the present problem can be solved by a positive resist composition containing both polymer having acid-decomposable groups and sulfonic acid generator having a specified phenacyl group.

Specifically, the invention is achieved by an embodiment described below.

(1) A positive resist composition, comprising:

(A) a phenolic polymer having a property of being insoluble or hardly soluble in an aqueous alkali solution and becoming soluble in an aqueous alkali solution by the action of an acid, in which the phenolic polymer includes a repeating unit containing at least one selected from the group consisting of an acetal-protected phenolic hydroxyl group, a ketal-protected phenolic hydroxyl group, a tertiary ester-protected carboxyl group and a tetrahydropyranyl-protected carboxyl group; and (B) a compound represented by the following formula (I) and capable of generating an acid upon irradiation with one of actinic rays and radiation;

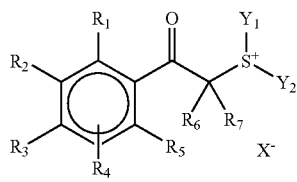

wherein $R_1$ to $R_5$ each independently represents a hydrogen atom, a nitro group, a halogen atom, an alkyl group, an alkoxy group, an alkyloxycarbonyl group, an aryl group or an acylamino group, and at least two of $R_1$ to $R_5$ may combine to form a ring; $R_6$ and $R_7$ each represent a hydrogen atom; $Y_1$ and $Y_2$ each independently represents an alkyl group, an alkenyl group or an aryl group, $Y_1$ and $Y_2$ may combine to form a ring together with $S^+$, provided that at least one of $Y_1$ and $Y_2$ is an aryl group; at least one of $R_1$ to $R_5$ and at least one of $Y_1$ and $Y_2$ may combine to form a ring; the compound (B) may have at least two structures represented by formula (I) by being combined via a linkage group at any sites selected from $R_1$ to $R_7$, $Y_1$ or $Y_2$; $X^-$ represents an alkanesulfonic acid anion containing at least 3 carbon atoms, a benzenesulfonic acid anion having at least one substituent selected from a halogen atom, a halogen-substituted alkyl group or an alkyl group containing at least two carbon atoms, a naphthalenesulfonic acid anion, an anthracenesulfonic acid anion or a camphorsulfonic acid anion.

(2) The positive resist composition as described in the item (1), which further comprises (D) a nitrogen-containing basic compound.

(3) The positive resist composition as described the item (1) or (2), which further comprises a compound capable of generating an acid upon irradiation with one of actinic rays and radiation, in which the compound is not the compound represented by formula (I).

(4) The positive resist composition as described in any one of the items (1) to (3), wherein the phenolic polymer (A) includes a phenol resin, a novolak resin, and a polymer containing hydroxystyrene units in the molecule, each of polymers having: a property of being insoluble or hardly soluble in an aqueous alkali solution and becoming soluble in an aqueous alkali solution by the action of an acid; and including a repeating unit containing at least one selected from the group consisting of an acetal-protected phenolic hydroxyl group, a ketal-protected phenolic hydroxyl group, a tertiary ester-protected carboxyl group and a tetrahydropyranyl-protected carboxyl group.

(5) The positive resist composition as described in any one of the items (1) to (3), wherein the phenolic polymer (A) includes a polymer containing hydroxystyrene units in the molecule, the polymer having: a property of being insoluble or hardly soluble in an aqueous alkali solution and becoming soluble in an aqueous alkali solution by the action of an acid; and including a repeating unit containing at least one selected from the group consisting of an acetal-protected phenolic hydroxyl group, a ketal-protected phenolic hydroxyl group, a tertiary ester-protected carboxyl group and a tetrahydropyranyl-protected carboxyl group.

(6) The positive resist composition as described any one of the items (1) to (5), which further comprises at least one of a fluorine-containing surfactant, a silicon-containing surfactant and a surfactant containing both a fluorine and silicon atom.

DETAILED DESCRIPTION OF THE INVENTION

Compounds used in the invention are illustrated below in detail.

[1] Phenolic Polymer Having Property of Being Insoluble or Hardly Soluble in Aqueous Alkali Solution but Becoming Soluble in Aqueous Alkali Solution Under Action of Acid (Component (A)):

The term "phenolic polymer" as used herein refers to the polymer containing phenol structures in the main chain or side chains thereof. Suitable examples of such a polymer include phenol resin, novolak resin and polymers containing hydroxystyrene units in their respective molecules. Of these polymers, polymers containing hydroxystyrene units in their respective molecules are preferred over the others.

The phenolic polymers used suitably in the invention are polymers which are insoluble or hardly soluble in aqueous alkali solutions but become soluble in aqueous alkali solutions by undergoing the action of acids and, what is more, contain the groups of at least one kind selected from acetal- or ketal-protected phenolic hydroxyl groups or tertiary ester- or tetrahydropyranyl-protected carboxyl groups as groups capable of decomposing by the action of acids and producing alkali-soluble groups (acid-decomposable groups).

As a moiety having an acetal- or ketal-protected phenolic hydroxyl group, the group represented by —Ar—O—$B_0$ is suitable.

Herein, Ar represents a monocyclic or polycyclic divalent aromatic group which may have a substituent.

$B^0$ is represented by —C ($R^{04}$)($R^{05}$)—O—$R^{06}$. $R^{04}$ is a hydrogen atom or an alkyl group (preferably containing 1 to 6 carbon atoms), preferably a hydrogen atom or an alkyl group containing 1 to 4 carbon atoms. $R^{05}$ is an alkyl group, preferably an alkyl group containing 1 to 6 carbon atoms, far preferably an alkyl group containing 1 to 4 carbon atoms. $R^{06}$ represents a linear, branched or cyclic alkyl group (preferably a linear or branched alkyl group containing 1 to 24 carbon atoms, or a cycloalkyl group containing 4 to 10 carbon atoms), an aryl group (preferably containing 6 to 24 carbon atoms), a thiophenyl group which may have a substituent, or a group formed by combining any two of the groups recited above. Examples of such a substituent include an alkyl group (preferably containing 1 to 5 carbon atoms) and an alkoxy group (preferably containing 1 to 5 carbon atoms). Each of the groups may have at least one linkage group selected from ether, thioether, ester or ketone at some midpoint therein. $R^{05}$ and $R^{06}$ may combine to from a ring.

Of these groups, the group preferred as $R^{06}$ is a linear, branched or cyclic alkyl group (preferably a linear or branched alkyl group containing 1 to 16 carbon atoms and a cycloalkyl group containing 5 to 8 carbon atoms), an aryl group (preferably an aryl group containing 6 to 20 carbon atoms) or a group formed by combining these groups (which may contain at least one linkage group selected from ether, thioether, ester or ketone at some midpoint therein), particularly preferably a linear or branched alkyl group containing 1 to 12 carbon atoms, a cyclohexyl group, an aryl group containing 6 to 16 carbon atoms or a group formed by combining these groups (which may contain at least one linkage group selected from ether, thioether or ester at some midpoint therein).

As a moiety having a tertiary ester- or tetrahydropyranyl-protected carboxyl group, the group represented by —$R^0$—COO-$A^0$ is suitable.

$R^0$ represents a single bond or a divalent linkage group, preferably a single bond, an alkylene group (preferably containing 1 to 12 carbon atoms), an arylene group (preferably containing 6 to 12 carbon atoms) or an aryleneoxyalkylene group (preferably containing 7 to 16 carbon atoms), particularly preferably a single bond, a phenylene group or a phenyleneoxyalkylene group containing 7 to 10 carbon atoms.

$A^0$ represents a group of formula —C($R^{01}$)($R^{02}$)($R^{03}$), or a tetrahydropyranyl group. Each of $R^{01}$, $R^{02}$ and $R^{03}$ represents an alkyl group (preferably containing 1 to 8 carbon atoms), a cycloalkyl group (preferably containing 4 to 10 carbon atoms), an aryl group (preferably containing 6 to 16 carbon atoms) or an aralkyl group (preferably containing 7 to 16 carbon atoms), or at least two of $R^{01}$ to $R^{03}$ combines to form a ring or a bridged structure.

Each of $R^{01}$ to $R^{03}$ is preferably a 1–6C alkyl group, a 5–8C cycloalkyl group, a 6–14C aryl group or a 7–14C aralkyl group. Of these groups, 1–4C alkyl, cyclohexyl, 6–12C aryl and 7–12C aralkyl groups are suitable in particular.

Additionally, the repeating units having the acid-decomposable groups as cited above may have alkali-soluble groups, such as unprotected phenolic hydroxyl or carboxyl groups.

It is preferable that the polymers used in the invention contain those acid-decomposable groups in their side chains. The mother resins of such polymers are alkali-soluble resins containing —OH or —COOH groups, preferably —$R^0$—COOH or —Ar—OH groups, in their side chains, examples of which are recited hereinafter.

It is appropriate that such alkali-soluble resins be dissolved in alkali at a speed of at least 170 A/sec, especially at least 330 A/sec, as measured with 0.261N tetramethylammonium hydroxide (TMAH) at 23° C. (wherein A stands for angstrom).

From such a point of view, alkali-soluble resins preferred in particular include poly(o-hydroxystyrene), poly(m-hydroxystyrene), poly(p-hydroxystyrene), copolymers of at least two of o-, m- and p-hydroxystyrenes, hydrogenated poly(hydroxystyrene)s, halogen- or alkyl-substituted poly(hydroxystyrene)s, partially O-alkylated or O-acylated poly(hydroxystyrene) s, styrene-hydroxystyrene copolymers, α-methylstyrene-hydroxystyrene copolymers and hydrogenated novolak resins.

The phenolic polymers usable as Component (A) in the invention can be prepared by causing reaction between alkali-soluble resins and precursors of the acid-decomposable groups, or by copolymerizing alkali-soluble resin monomers to which acid-decomposable groups are bound and various other monomers, in accordance with the methods as disclosed in European Patent No. 254853, JP-A-2-25850, JP-A-3-223860 and JP-A-251259.

Examples of Component (A) used in the invention are illustrated below, but these examples should not be construed as limiting the scope of the invention.

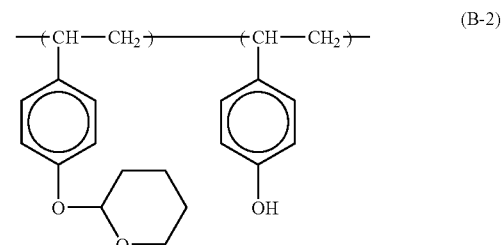
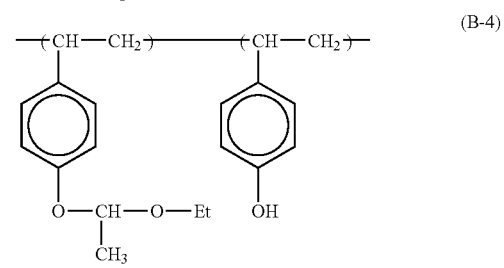
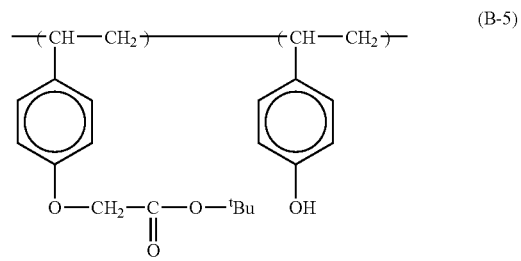
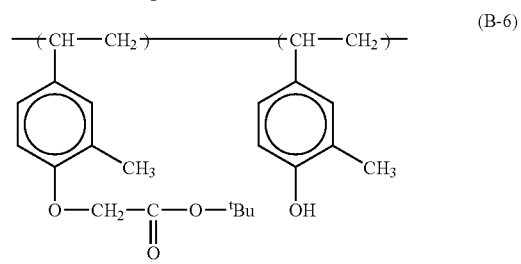
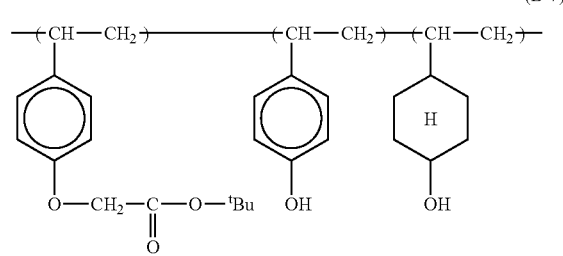
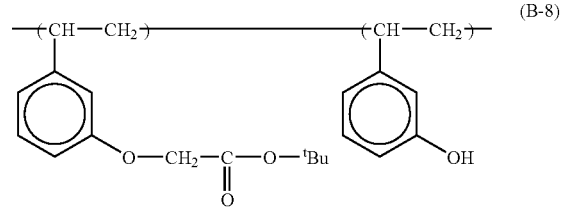
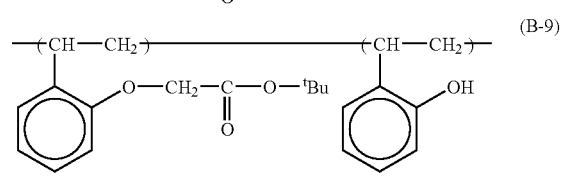

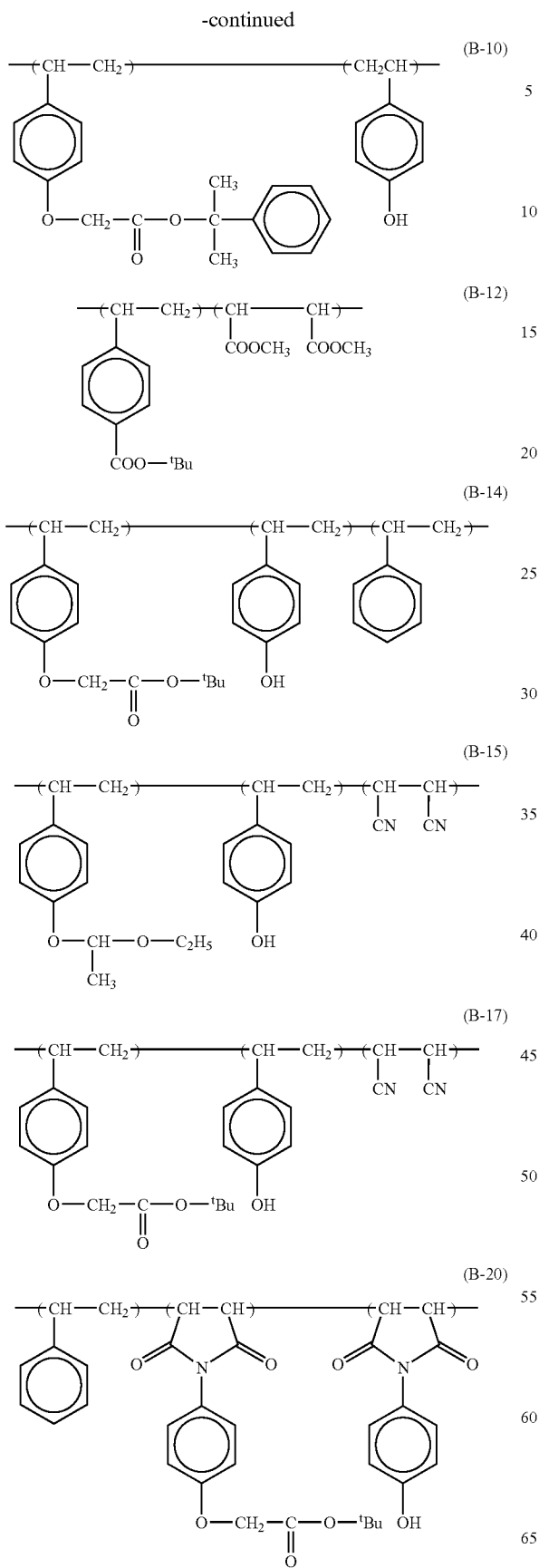

-continued
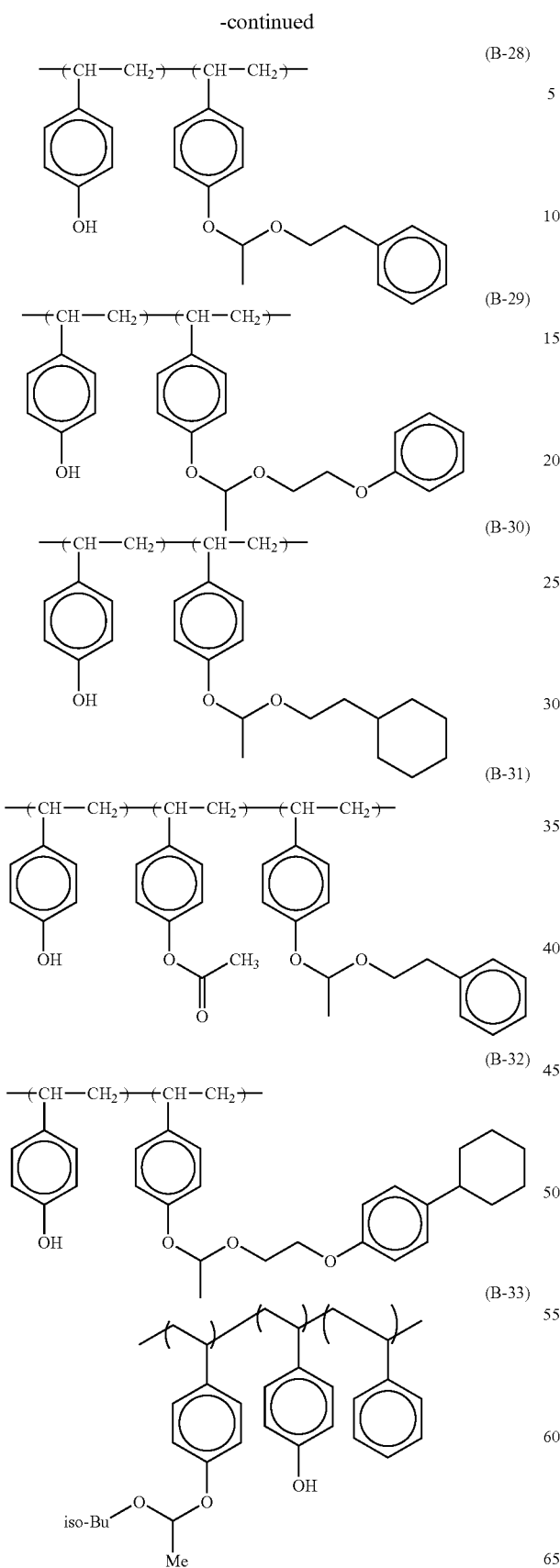
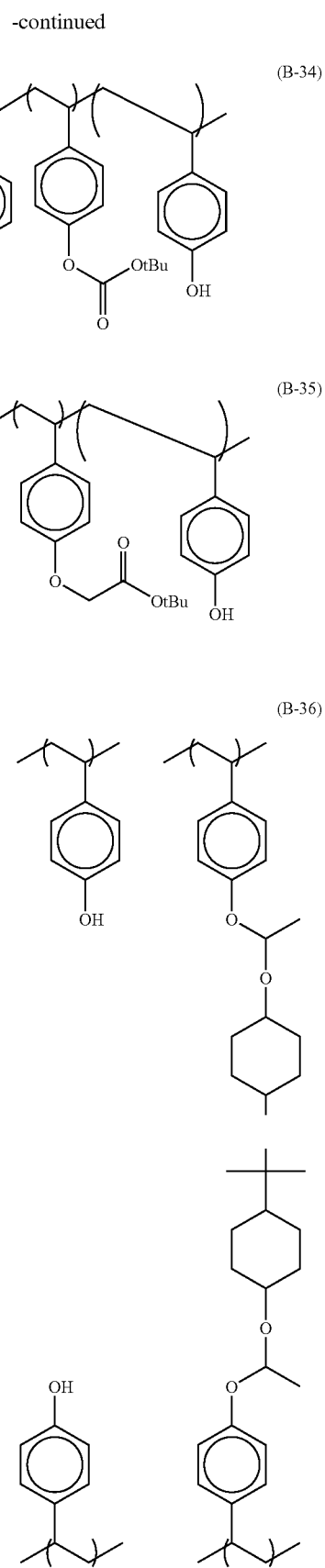

-continued

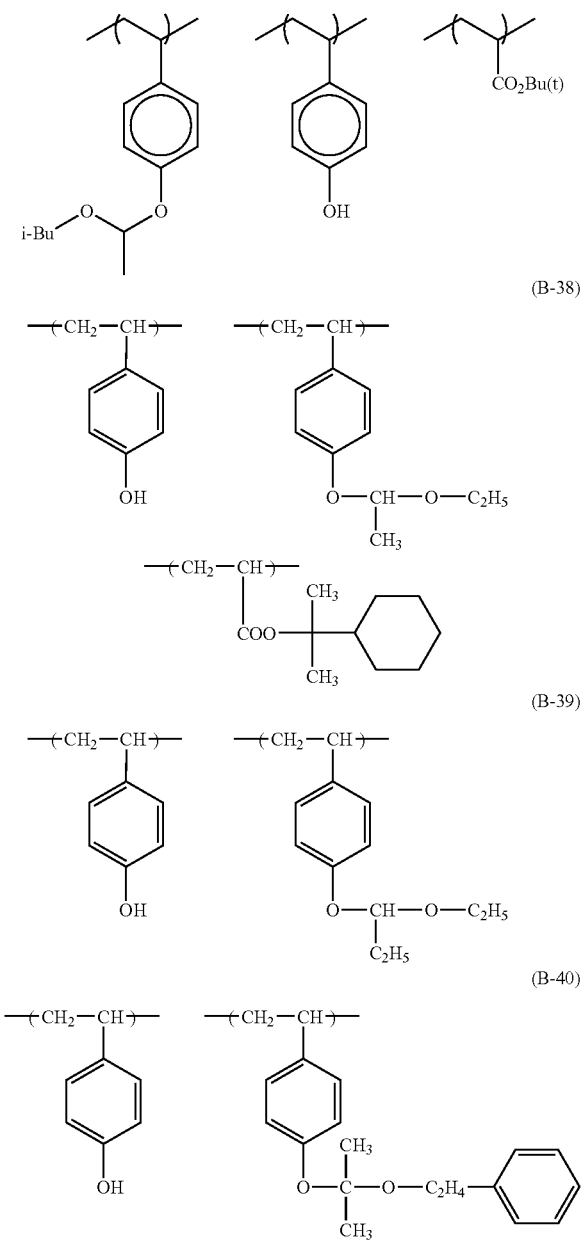

The content of acid-decomposable groups in the present resin is represented by A/(A+S) when the number of acid-decomposable groups contained in the resin is symbolized by A and the number of alkali-soluble groups which are not protected by acid-decomposable groups is symbolized by S. The suitable content is from 0.01 to 0.7, preferably from 0.05 to 0.50, far preferably from 0.05 to 0.40. The range of A/(A+S)>0.7 is undesirable because the resin having its acid-decomposable group content in such a range becomes causes of film shrinkage after PEB, poor adhesion to a substrate and scum. And the range of A/(A+S)<0.01 is also undesirable because conspicuous standing waves remain occasionally on the side walls of patters.

The suitable weight average molecular weight (Mw) of Component (A) is from 2,000 to 200,000. When the Mw is lower than 2,000, there is a tendency of decline in resist film thickness to become serious because the development occurs in unexposed areas also. On the other hand, the Mw greater than 200,000 is apt to cause reduction in the speed at which the resin itself is dissolved in alkali and decrease the sensitivity. The range of the Mw preferably extends from 5,000 to 100,000, and far preferably from 8,000 to 50,000.

Further, the suitable molecular weight distribution (Mw/Mn) is from 1.0 to 4.0, preferably from 1.0 to 2.0, far preferably from 1.0 to 1.6.

The term "weight average molecular weight" as used herein is defined as the molecular weight measured by gel permeation chromatography and calculated in terms of polystyrene.

The polymer of Component (A) may be a combination of two or more of phenolic polymers as mentioned above.

It is appropriate that the polymer of Component (A) be added in a proportion of 80 to 98 weight %, preferably 85 to 96 weight %, to total solids in the positive resist composition.

[2] Compound Represented by Formula (I) and Capable of Generating Acid Upon Irradiation with Actinic Ray or Radiation (Component (B)):

The present resist composition contains a compound represented by formula (I) as compound capable of generating an acid upon irradiation with an actinic ray or radiation (acid generator).

In formula (I), each of $R_1$ to $R_5$ represents a hydrogen atom, a nitro group, a halogen atom, an alkyl group, an alkoxy group, an alkyloxycarbonyl group, an aryl group or an acylamino group, or at least two of $R_1$ to $R_5$ may combine to form a ring.

$R_6$ and $R_7$ each represent a hydrogen atom.

Each of $Y_1$ and $Y_2$ represents an alkyl group, an alkenyl group or an aryl group, provided that at least either $Y_1$ or $Y_2$ is an aryl group, or $Y_1$ and $Y_2$ may combine to form a ring together with the $S^+$.

In addition, at least one of $R_1$ to $R_5$ and at least either $Y_1$ or $Y_2$ may combine to form a ring.

Further, the compound of Component (B) may contain at least two structures represented by formula (I) by combining them via a linkage group at any sites selected from $R_1$ to $R_7$, $Y_1$ or $Y_2$ $X^-$ represents an alkanesulfonic acid anion containing at least 3 carbon atoms, a benzenesulfonic acid anion having at least one substituent selected from halogen atoms, halogen-substituted alkyl groups or alkyl groups containing at least two carbon atoms, a naphthalenesulfonic acid anion, an anthracenesulfonic acid anion or a camphorsulfonic acid anion.

The alkyl group or the alkyl moiety in the acylamino group represented by $R_1$ to $R_7$ each is preferably a 1–10C alkyl group. Such an alkyl group may have any of linear, branched and cyclic structures, with examples including a methyl group, an ethyl group, a propyl group, an n-butyl group, a sec-butyl group, a t-butyl group, a cyclobutyl group, a pentyl group, a neopentyl group, a cyclopentyl group, a hexyl group, a cyclohexyl group, a heptyl group, an octyl group, a nonyl group and a decyl group.

The alkoxy group or the alkoxy moiety in the alkyloxycarbonyl group represented by $R_1$ to $R_5$ each is preferably a 1–10C alkoxy group, with examples including a methoxy group, an ethoxy group, a propoxy group, a butoxy group, a pentyloxy group, a hexyloxy group, a cyclohexyloxy group, a heptyloxy group, an octyloxy group, a nonyloxy group and a decyloxy group.

The aryl group represented by $R_1$ to $R_7$ each is preferably a 6–14C aryl group, with examples including a phenyl group, a tolyl group and a naphthyl group.

The halogen atom represented by $R_1$ to $R_5$ each is a fluorine atom, a chlorine atom, a bromine atom or an iodine atom.

The alkyl group represented by $Y_1$ and $Y_2$ each is preferably a 1–20C alkyl group. Such an alkyl group may be a linear, branched or cyclic alkyl group, with examples including a methyl group, an ethyl group, a propyl group, an isopropyl group, an n-butyl group, an iso-butyl group, a t-butyl group, an n-hexyl group, a cyclohexyl group, an octyl group and a dodecyl group. Examples of an alkyl group far preferred as $Y_1$ and $Y_2$ each include linear, branched and cyclic alkyl groups containing 3 to 20 carbon atoms, such as a propyl group, an isopropyl group, an n-butyl group, an iso-butyl group, a t-butyl group, an n-hexyl group, a cyclohexyl group, an octyl group and a dodecyl group. Of these groups, linear, branched and cyclic alkyl groups containing 4 to 12 carbon atoms, such as an n-butyl group, an iso-butyl group, a t-butyl group, an n-hexyl group, a cyclohexyl group, an octyl group and a dodecyl group, are preferred in particular.

The alkenyl group represented by $Y_1$ and $Y_2$ each is preferably a 2–6C alkenyl group, with examples including a vinyl group, a propenyl group, a butenyl group and a hexenyl group.

The aryl group represented by $Y_1$ and $Y_2$ each is preferably a 6–18C aryl group, with examples including a phenyl group, a naphthyl group and an anthryl group. Of these groups, a phenyl group and a naphthyl group are preferred in particular.

At least either $Y_1$ or $Y_2$ is an aryl group. In other words, either $Y_1$ or $Y_2$ may be an aryl group, or both $Y_1$ and $Y_2$ may be aryl groups. In addition, $Y_1$, $Y_2$ and $S^+$ maybe combined together to form a ring. More specifically, the aryl group of $Y_1$ (or $Y_2$), $Y_2$ (or $Y_1$) and $S^+$ may cooperate to form a ring.

When any of $R_1$ to $R_5$ represent groups having substituents, the groups are preferably substituted alkyl groups.

The total number of carbon atoms contained in $R_1$ to $R_5$ is preferably from 1 to 6, far preferably 1 or 2. On the other hand, the case where all of $R_1$ to $R_5$ are hydrogen atoms is highly advantageous, too.

$X^-$ represents an alkanesulfonic acid anion containing at least 3 carbon atoms, a benzenesulfonic acid anion having at least one substituent selected from halogen atoms, halogen-substituted alkyl groups or alkyl groups containing at least two carbon atoms, a naphthalenesulfonic acid anion, an anthracenesulfonic acid anion or a camphorsulfonic acid anion.

The alkyl group corresponding to the alkane in a $3 \leq C$ alkanesulfonic acid anion represented by $X^-$ is preferably a 3–25C alkyl group, far preferably a 4–20C alkyl group. Such an alkyl group may have a substituent. Examples of the substituent include halogen atoms (fluorine, chlorine, bromine and iodine atoms), a hydroxyl group, alkoxy groups (preferably containing 1 to 5 carbon atoms), aryl groups (preferably containing 6 to 10 carbon atoms) and alkylthio groups (preferably containing 1 to 5 carbon atoms).

The benzenesulfonic acid anion of $X^-$ has on its benzene ring at least one substituent selected from halogen atoms, halogen-substituted alkyl groups or alkyl groups containing at least two carbon atoms.

As to the halogen atoms, fluorine and bromine atoms are preferable, and a fluorine atom is especially preferred. As to the halogen-substituted alkyl groups, fluorine- or bromine-substituted 1–20C linear or branched alkyl groups are preferable, and fluorine-substituted 1–12C linear or branched alkyl groups are especially preferred. As to the alkyl groups containing at least 2 carbon atoms, 2–12C linear or branched alkyl groups are preferable, and 2–8C linear or branched alkyl groups are especially preferred.

The phenyl group in the benzenesulfonic acid anion may other substituents in addition to the substituents specified above. Examples of the other substituents include a hydroxyl group, alkoxy groups (preferably containing 1 to 5 carbon atoms), alkyloxycarbonyl groups (preferably containing 2 to 6 carbon atoms), a cyano group, alkylthio groups (preferably containing 1 to 5 carbon atoms), cycloalkyl groups (preferably containing 3 to 10 carbon atoms) and a nitro group.

The naphtyl or anthryl group contained respectively in the naphthalenesulfonic or anthracenesulfonic acid anion of $X^-$ may have a substituent. Examples of such a substituent include not only the substituents specified to be present on the benzene ring of the benzenesulfonic acid but also other substituents recited above as those which the phenyl group in the benzenesulfonic acid ion may have.

Suitable examples of $X^-$ include 3–16C alkanesulfonic acid anions substituted by fluorine atoms at their respective 1-positions, fluorobenzenesulfonic acid anions, benzenesulfonic acid anions having 1–10C fluoroalkyl groups as their respective substituents, benzenesulfonic acid anions having 2–20C alkyl groups as their respective substituents, and a camphorsulfonic acid anion. Of these anions, 3–12C perfluoroalkanesulfonic acid anions, benzenesulfonic acid anions having 1–10C fluoroalkyl groups as their respective substituents and benzenesulfonic acid anions having 2–10C alkyl groups as their respective substituents are especially preferred.

In formula (I), at least one of $R_1$ to $R_5$ and at least either $Y_1$ or $Y_2$ may also combine to form a ring.

In this case, the group formed by combining at least one of $R_1$ to $R_5$ and at least either $Y_1$ or $Y_2$ is preferably a 2–10C alkylene group, such as an ethylene group, a propylene group, a butylene group, a pentylene group or a hexylene group.

On the other hand, at least two structures of formula (I) may be contained in the present compound of Component (B) by being combined via a linkage group at any sites selected from $R_1$ to $R_7$, $Y_1$ or $Y_2$.

In the compound represented by formula (I), it is advantageous that either $Y_1$, or $Y_2$, or both are aryl groups and each of $R_1$ to $R_5$ is a hydrogen atom or an alkyl group.

The following are preferred conditions of formula (I):

(a) Each of $R_1$ to $R_5$ is a hydrogen atom, and either $Y_1$, or $Y_2$, or both are aryl groups.

(b) Each of $R_1$, $R_2$, $R_4$ and $R_5$ is a hydrogen atom, $R_3$ is an alkyl group, and either $Y_1$, or $Y_2$, or both are aryl groups.

(c) Any one of $R_1$ to $R_5$ is an alkyl group, the others are hydrogen atoms, and either $Y_1$, or $Y_2$, or both are aryl groups.

Suitable examples of the compound of Component (B) are illustrated below, but these examples should not be construed as limiting the scope of the invention.

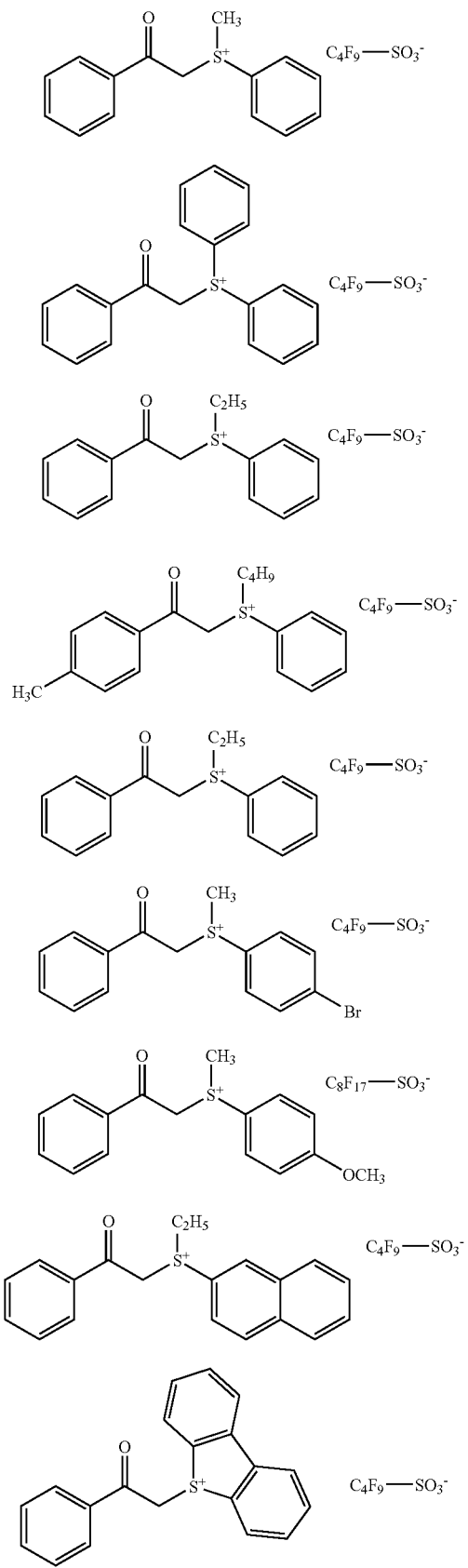

-continued

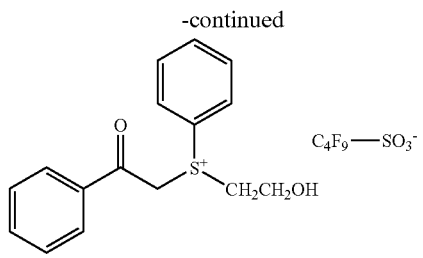
B-16

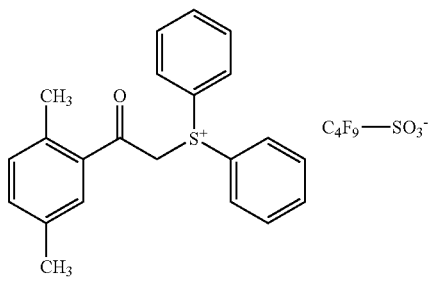
B-17

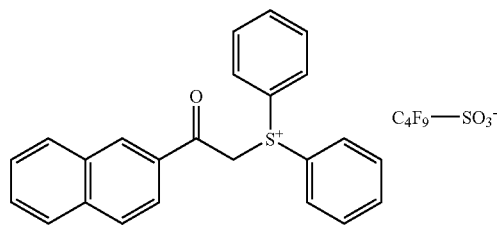
B-18

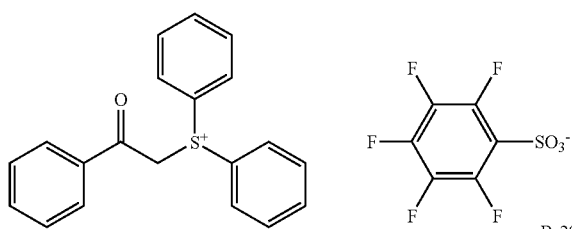
B-19

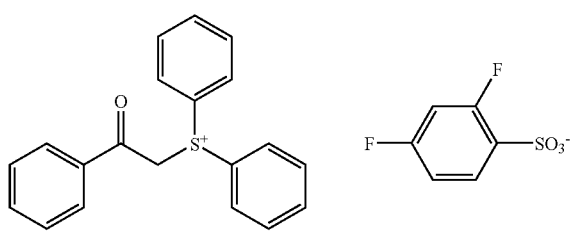
B-20

The suitable content of the compound of Component (B) in the present positive resist composition is from 0.1 to 20 weight %, preferably from 0.5 to 15 weight %, particularly preferably from 1.0 to 12 weight %, on a solids basis.

In addition, the compound of Component (B) may be a combination of two or more of the compounds as recited above.

[3] Other Acid Generators (Component (C)):

In the invention, acid generators other than the compounds of the formula (I) recited above as Component (B) may further be used.

Photo-acid generators usable in combination with Component (B) can be selected appropriately from photo-initiators for cationic photopolymerization, photo-initiators for radical photopolymerization, photodecoloring agents for dyes, photodiscoloring agents, compounds used in microresist and known to generate acids when irradiated with actinic rays or radiation, or mixtures of two or more thereof.

Examples of such photo-acid generators include diazonium salts, phosphonium salts, iodonium salts, imide sulfonates, oxime sulfonates, diazodisulfones, disulfones, and o-nitrobenzylsulfonates.

In addition, it is also possible to use polymers having main or side chains into which groups or compounds capable of generating acids by the action of an actinic ray or radiation are introduced, examples of which are disclosed in U.S. Pat. No. 3,849,137, German Patent No. 3914407, JP-A-63-26653, JP-A-55-164824, JP-A-62-69263, JP-A-63-146038, JP-A-63-163452, JP-A-62-153853 and JP-A-63-146029.

Further, the compounds capable of generating acids by the action of light as disclosed in U.S. Pat. No. 3,779,778 and European Patent No. 126,712 can be used, too.

The acid generators having an advantage in enhancement of image qualities, such as resolution and pattern profile, when they are used in combination with the compounds of formula (I) are sulfonic acid generators. Examples thereof include diazonium salts, phosphonium salts, iodonium salts and sulfonium salts.

Of these compounds, the compounds illustrated below are examples of acid generators preferred in particular.

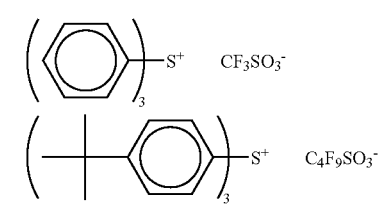

-continued
(z5) 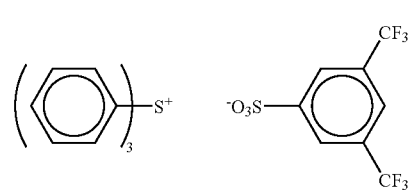 (z6) 
(z7) 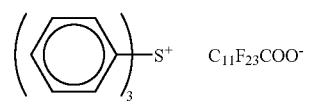 (z8) 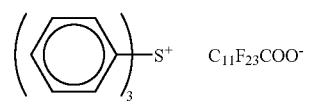
(z9) 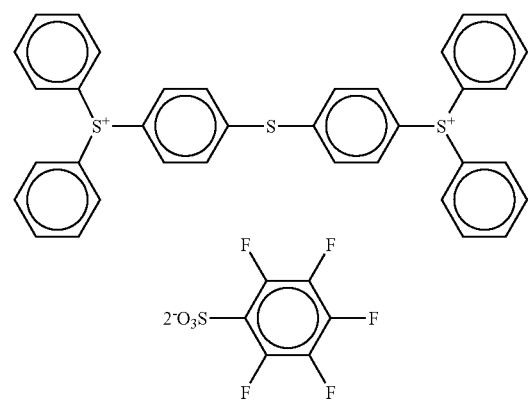 (z10) 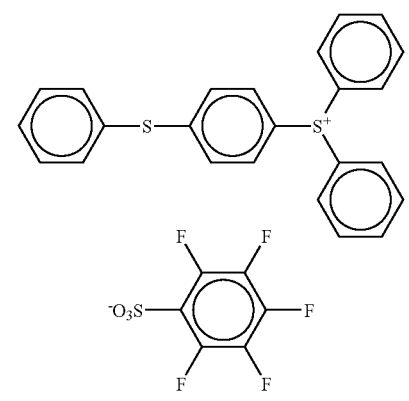
(z11) 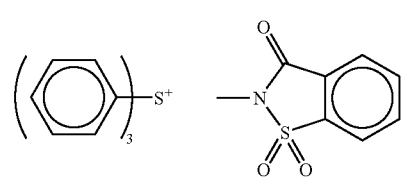 (z12) 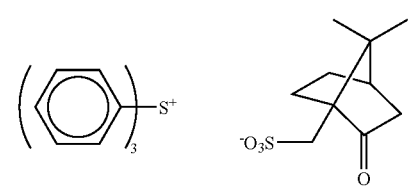
(Z13) 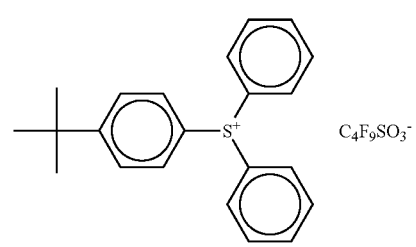 (Z14) 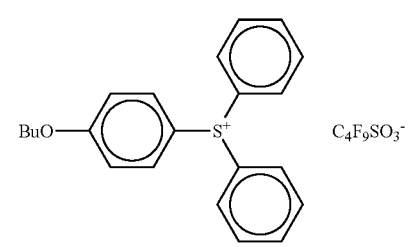
(Z15) 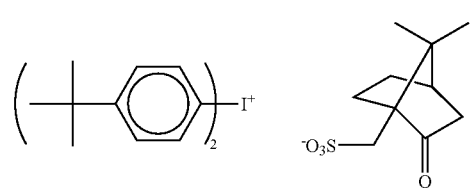 (Z16) 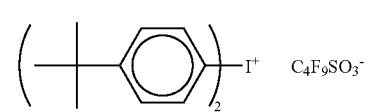
(Z17) 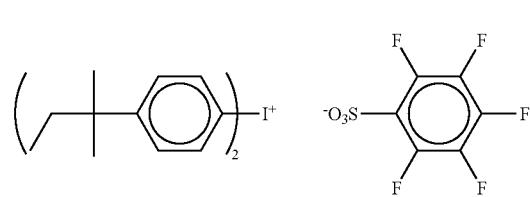 (Z18) 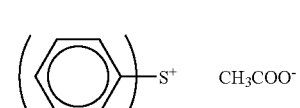

-continued
(Z19)
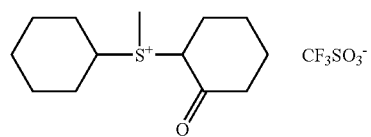
(Z20)
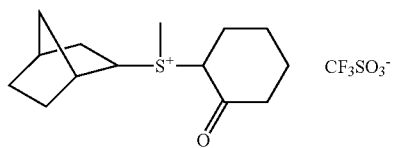
(Z21)
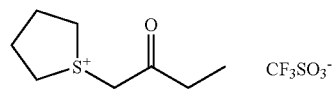
(Z22)
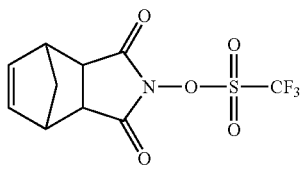
(Z23)
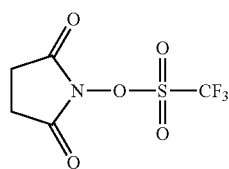
(Z24)
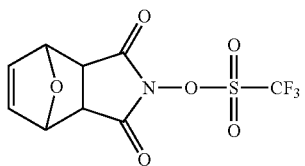
(z25)
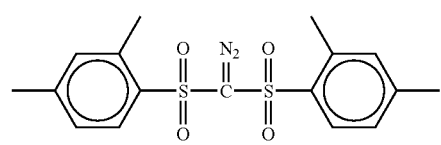
(z26)
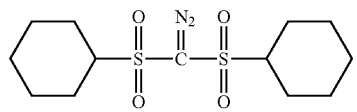
(z27)
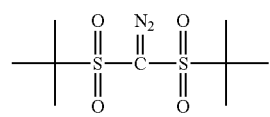
(z28)
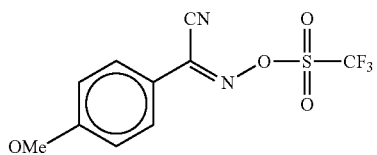
(z29)
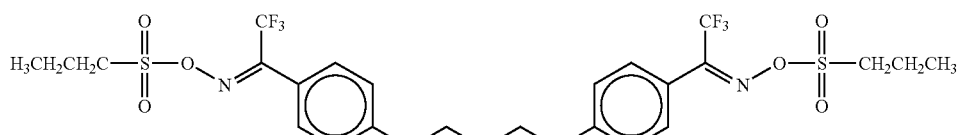
(z33)
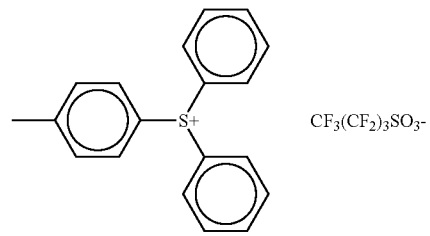
(z34)
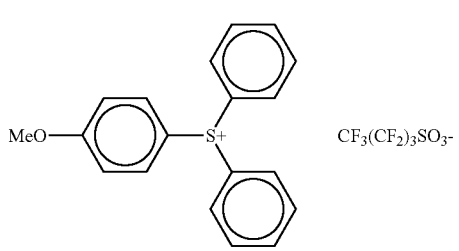
(z35)
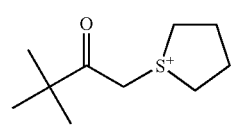
(z36)
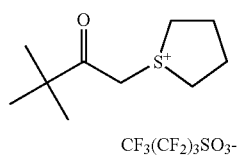
(z37)
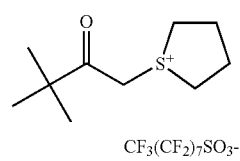
(z38)
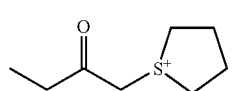
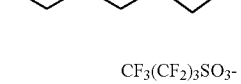

-continued

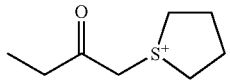

CF₃(CF₂)₇SO₃⁻

(z39)

The ratio of the compound(s) of Component (B) to other acid generators usable in combination therewith is generally from 100/0 to 5/95, preferably from 30/70 to 5/95, far preferably from 50/50 to 10/90, by mole.

[4] Other Components:

The present positive resist composition can further contain a nitrogen-containing basic compound, a dye, a radical generator and a surfactant, if needed.

1. Nitrogen-containing Basic Compound

In the invention, it is advantageous to use a nitrogen-containing basic compound from the viewpoints of enhancing properties, such as resolution, and improving storage stability.

The nitrogen-containing basic compounds usable to advantage in the invention are compounds more strongly basic than phenol.

Examples of a chemical setting suitable for such a basic compound include structures represented by the following formulae (A) to (E). The formulae (B) to (E) each may be a part of cyclic structure.

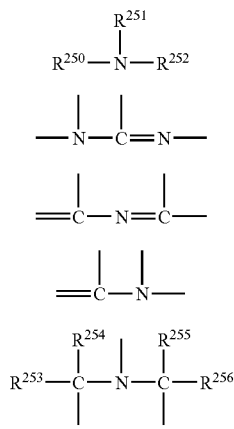

Herein, $R^{250}$, $R^{251}$ and $R^{252}$, which may be the same or different, each represent a hydrogen atom, a 1–6C alkyl group, a 1–6C aminoalkyl group, a 1–6C hydroxyalkyl group, or a 6–20C substituted or unsubstituted aryl group. Further, $R^{250}$ and $R^{251}$ may combine to form a ring.

$R^{253}$, $R^{254}$, $R^{255}$ and $R^{256}$, which may be the same or different, each represent a 1–6C alkyl group.

Preferable basic compounds are nitrogen-containing basic compounds which have at least two per molecule of nitrogen atoms differing in chemical setting, and especially preferable compounds are compounds which each have both substituted or unsubstituted amino group and nitrogen-containing cyclic structure, or an alkylamino group.

Suitable examples of such compounds include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted imidazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a subsituted or unsubstituted piperazine, a subsituted or unsubstituted aminomorpholine, and a substituted or unsubstituted aminoalkylmorpholine. Examples of substituents suitable for the above-recited compounds include an amino group, an aminoalkyl group, an alkylamino group, an aminoaryl group, an arylamino group, an alkyl group, an alkoxy group, anacylgroup, anacyloxygroup, anarylgroup, anaryloxy group, a nitro group, a hydroxyl group and a cyano group.

Examples of basic compounds preferred in particular include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethyl-piperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine. However, these examples should not be construed as limiting the scope of the basic compounds usable in the invention.

Those nitrogen-containing basic compounds are used alone or as combinations of two or more thereof.

It is appropriate that the ratio between the acid generators and the nitrogen-containing basic compound(s) used in the present composition, the (acid generator)/(nitrogen-containing basic compound) ratio, be from 2.5 to 300 by mole. When the ratio is lower than 2.5 by mole, decrease in sensitivity and lowering of resolution occur in some cases. When the ratio is higher than 300 by mole, on the other hand, the thickening of resist patterns during a period from the completion of exposure to the start of heat treatment becomes serious and the resolution is lowered in some times. The acid generator/nitrogen-containing basic compound ratio (by mole) is preferably from 5.0 to 200, far preferably from 7.0 to 150.

2. Dyes

Dyes suitably used in the present composition are fat dyes and basic dyes. Examples of such dyes include Oil Yellow

101, Oil Yellow #103, Oil Pink #312, Oil Green BG, Oil Blue BOS, Oil Blue #603, Oil Black BY, Oil Black T-505 (all of which are products of Orient Chemical Industries, Ltd.), Crystal Violet (CI42555), Methyl Violet (CI42535), Rhodamine B (CI45170B), Malachite Green (CI42000) and Methylene Blue (CI52015).

3. Solvent

The present resist composition is prepared by dissolving the ingredients as mentioned above in a solvent appropriate therefor, and coated on a substrate. The total solids concentration in the solution prepared herein is generally from 2 to 30 weight %, preferably from 3 to 25 weight %.

Examples of a solvent usable herein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethylacetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran. These solvents may be used alone or as a mixture of two or more thereof.

4. Surfactants

Surfactants can also be added to the solvents as recited above. Examples of surfactant usable herein include nonionic surfactants, such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl aryl ethers (e.g., polyoxyethylene octyl phenol ether, polyoxyethylene nonyl phenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylenesorbitan fatty acid esters (e.g., polyoxyethylenesorbitan monolaurate, polyoxyethylenesorbitan monopalmitate, polyoxyethylenesorbitan monostearate, polyoxyethylenesorbitan trioleate, polyoxyethylenesorbitan tristearate); fluorine- or silicon-containing surfactants, such as Eftop EF301, EF303 and EF352 (produced by Shin-Akita Kasei K.K.), Megafac F171 and F173 (produced by Dainippon Ink & Chemicals, Inc.), Florad FC430 and FC431 (produced by Sumitomo 3M, Inc.),Asahi-GardAG710, SurflonS-382, SC101, SC102, SC103, SC104, SC105 and SC106 (produced by Asahi Glass Co., Ltd.), and Troysol S-366 (produced by Troy Chemical Industries, Inc.); organosiloxane polymer, KP-341 (produced by Shin-Etsu Chemical Industry Co., Ltd.); and acrylic or methacrylic acid-based (co) polymers, Polyflow No. 75 and No. 95 (produced by Kyoe-iSha Yushi Kagaku Kogyo K.K.). These surfactants are used in an amount of generally at most 2 parts by weight, preferably at most 1 parts by weight, per 100 parts by weight of the total solids in the present composition.

Those surfactants may be added alone or as combinations of two or more thereof.

Additionally, it is advantageous for the surfactant used in the present composition to include any of surfactants which contain at least one fluorine atom or/and at least one silicon atom per molecule (namely, any of fluorine-containing surfactants, silicon-containing surfactants and surfactants containing both fluorine and silicon atoms), or a combination of at least two of these surfactants.

Examples of such surfactants include the surfactants disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143,5,294,511 and 5,824,451. In addition, the following commercially available surfactants can be used as they are.

Examples of commercial surfactants usable herein include fluorine- or silicon-containing surfactants, such as Eftop EF301 and EF303 (produced by Shin-Akita Kasei K.K.), Florad FC430 and FC431 (produced by Sumitomo 3M, Inc.), Megafac F171, F173, F176, F189 and R08 (produced by Dainippon Ink & Chemicals, Inc.), Surflon S-382, SC101, SC102, SC103, SC104, SC105 and SC106 (produced by Asahi Glass Co., Ltd.) and Troysol S-366 (produced by Troy Chemical Industries, Inc.). In addition, organosiloxane polymer, KP-341 (produced by Shin-Etsu Chemical Industry Co., Ltd.) can be used as a silicon-containing surfactant.

In addition to known surfactants as recited above, specific polymers containing fluorinated aliphatic groups can be used as surfactants in the invention. Such polymers contain fluorinated aliphatic groups derived from fluorinated aliphatic compounds synthesized by a telomerization method (telomer method) or an oligomerization method (oligomer method) These fluorinated aliphatic compounds can be synthesized by the methods disclosed in JP-A-2002-90991.

The polymers suitable as the polymers containing fluorinated aliphatic groups are copolymers of fluorinated aliphatic group-containing monomers and poly(oxyalkylene) acrylates and/or poly (oxyalkylene) methacrylates, wherein the fluorinated aliphatic group-containing units may be distributed randomly or in blocks. Examples of those poly (oxyalkylene) groups include a poly(oxyethylene) group, a poly(oxypropylene) group and a poly(oxybutylene) group. In addition, the poly(oxyalkylene) groups maybe units containing alkylene groups differing in chain length in their respective oxyalkylene chains, such as poly(oxyethylene block-oxypropylene block-oxyethylene block combination) groups and poly(oxyethylene block-oxypropylene block combination) groups. Further, the copolymers of fluorinated aliphatic group-containing monomers and poly(oxyalkylene) acrylates (or methacrylates) may be binary copolymers or at least ternary copolymers prepared by copolymerizing at least two different kinds of fluorinated aliphatic group-containing monomers and at least two different kinds of poly(oxyalkylene) acrylates (or methacrylates) at a time.

Examples of a fluorinated aliphatic group-containing polymer commercially available as surfactant include Megafac F178, F-470, F-473, F-475, F-476 and F-472 (produced by Dainippon Ink & Chemicals, Inc.). Additional examples of a fluorinated aliphatic group-containing polymer include a copolymer of $C_6F_{13}$ group-containing acrylate (or methacrylate) and poly(oxyalkylene) acrylate (or methacrylate), a terpolymer of $C_6F_{13}$ group-containing acrylate (or methacrylate), poly(oxyethylene) acrylate (or methacrylate) and poly(oxypropylene) acrylate (or methacrylate), a copolymer of $C_8F_{17}$ group-containing acrylate (or methacrylate) and poly(oxyalkylene) acrylate (or methacrylate), and a terpolymer of $C_8F_{17}$ group-containing acrylate (or methacrylate), poly(oxyethylene) acrylate (or methacrylate) and poly(oxypropylene) acrylate (or methacrylate).

It is appropriate that these surfactants be used in a proportion of 0.0001 to 2 weight %, preferably 0.001 to 1 weight %, to the total weight of ingredients (exclusive of a solvent) in the positive resist composition.

[5] Photo-base Generators:

Examples of a photo-base generator which can be added to the present composition include the compounds disclosed in JP-A-4-151156, JP-A-4-162040, JP-A-5-197148, JP-A-5-5995, JP-A-6-194834, JP-A-8-146608, JP-A-10-83079 and European Patent No. 622682. More specifically, 2-nitrobenzylvarbamate, 2,5-dinitrobenzylcyclohexylcarbamate, N-cyclohexyl-4-methylphenylsulfonamide and 1,1-dimethyl-2-phenylethyl-N-isopropylcarbamate can be suitably used as photo-base generator. Such a photo-base generator is added for the purpose of improvement in resist pattern profile.

The present positive resist composition is coated on a substrate and forms a thin film. It is appropriate that this coating film have a thickness of from 0.05 to 4.0 μm.

In the invention, commercial inorganic or organic anti-reflecting coating can be used, if needed. Further, an anti-reflecting coating can be applied to an upper layer of the resist coating.

As an anti-reflecting coating which forms a lower layer of the resist coating, both inorganic and organic coatings can be used. The anti-reflecting coating of inorganic type is formed from titanium, titanium dioxide, titanium nitride, chromium oxide, carbon or amorphous silicon, and that of organic type is formed from a light absorbent and a polymeric material. The formation of the former coating requires equipment, such as a vacuum evaporator, a CVD apparatus or a sputtering apparatus. Examples of an anti-reflecting coating of organic type include the anti-reflecting coating disclosed in JP-B-7-69611 which contains a condensate produced from a diphenylamine derivative and formaldehyde-modified melamine resin, an alkali-soluble resin and a light absorbing agent, the anti-reflecting coating disclosed in U.S. Pat. No. 5,294,680 which is formed from a product of reaction between a maleic anhydride copolymer and a light absorbing agent of diamine type, the anti-reflecting coating disclosed in JP-A-6-118631 which contains a resin binder and a thermally cross-linking agent of methylolmelamine type, the anti-reflecting coating disclosed in JP-A-6-11865 which is formed from an acrylic resin containing carboxylic acid groups, epoxy groups and light-absorbing groups in each molecule, the anti-reflecting coating disclosed in JP-A-8-87115 which contains methylolmelamine and a light absorbing agent of benzophenone type, and the anti-reflecting coating disclosed in JP-A-8-179509 which is formed from polyvinyl alcohol resin to which a low molecular light-absorbing agent is added.

As to the anti-reflecting coating of organic type, it is also possible to use commercially available ones, such as DUV30 series and DUV40 series produced by Brewer Science Inc., and AR-2, AR-3 and AR-5 produced by Shipley Co., Ltd.

The process of forming patterns on a resist film for fabrication of high-precision integrated circuit elements includes sequentially the steps of coating the present positive resist composition on a substrate (e.g., a silicon/silicon dioxide-coated substrate, a glass substrate, an ITO substrate, a quartz/chromium oxide-coated substrate) directly or via one of the aforementioned anti-reflecting coatings which is provided in advance on such a substrate as recited above, irradiating the resist coating with high energy beams, such as KrF excimer laser, electron beams, X-rays or ionic beams, and heating, developing, rinsing and drying the irradiated resist coating. In this process, resist patterns of good quality can be formed.

As a developer for the present positive resist composition, an aqueous alkali solution (generally having a concentration of 0.1 to 10 weight %) can be used. Examples of an alkali usable therein include inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide, tetraethylammonium hydroxide and choline, and cyclic amines such as pyrrole and piperidine. To the aqueous alkali solution, alcohol, e.g., isopropyl alcohol, and a nonionic surfactant may further be added in appropriate amounts.

Of those developers, a solution of quaternary ammonium salt, preferably tetramethylammonium hydroxide or choline, is advantageous over the others.

EXAMPLES

Now, the invention will be illustrated in more detail by reference to the following examples, but these examples should not be construed as limiting the scope of the invention.

1. Synthesis Examples of Constituent Elements (1) Polymer

Synthesis Example 1

Synthesis of Polymer (B-21)

In 120 ml of butyl acetate, 32.4 g (0.2 mole) of p-acetoxystyrene and 7.01 g (0.07 mole) of t-butyl methacrylate were dissolved. While stirring this solution at 80° C. in a stream of nitrogen, three 0.033 g portions of azobisisobutyronitrile (AIBN) were added thereto at intervals of 2.5 hours. Thereafter, the stirring was continued for additional 5 hours to effect polymerization reaction. The reaction solution was poured into 1,200 ml of hexane to precipitate a white resin. The resin obtained was dried, and then dissolved in 200 ml of methanol.

This methanol solution was admixed with a solution containing 7.7 g (0.19 mole) of sodium hydroxide in 50 ml of water and heated under reflux for 1 hour, thereby effecting hydrolysis of the resin. Thereafter, the thus hydrolyzed solution was diluted with 200 ml of water, and then neutralized with hydrochloric acid to precipitate a white resin. This resin was filtered off, washed and then dried. The dried resin was dissolved into 200 ml of tetrahydrofuran, and dripped into 5L of ultra-pure water with vigorous stirring to effect re-precipitation. This re-precipitation procedure was repeated three times. The re-precipitated matter was dried at 120° C. for 12 hours in a vacuum drier. Thus, the intended p-hydroxystyrene-t-butyl methacrylate copolymer was obtained.

Synthesis Example 2

Synthesis of Polymer (B-32)

In 300 ml of toluene was dissolved 83.1 g (0.5 mole) of p-cyclohexylphenol. Thereto, 150 g of 2-chloroethyl vinyl ether, 25 g of sodium hydroxide, 5 g of tetrabutylammonium bromide and 60 g of triethylamine were added and underwent reaction at 120° C. for 5 hours. The resulting reaction solution was washed with water, and therefrom the excess chloroethyl vinyl ether and toluene were distilled away. The oil thus obtained was purified by reduced-pressure distillation to yield 4-cyclohexylphenoxyethyl vinyl ether.

In 80 ml of THF were dissolved 20 g of poly(p-hydroxystyrene), VP-8000 (produced by Nippon Soda Co., Ltd.), and 6.5 g of 4-cyclohexylphenoxyethyl vinyl ether. Thereto, 0.01 g of p-toluenesulfonic acid was added. The resulting mixture underwent reaction for 18 hours at room temperature. The reaction solution was dripped into 5L of distilled water with vigorous stirring, and fine solid particles precipitated out were filtered off and dried. Thus, Polymer (B-32) was obtained.

Other phenolic polymers usable as Component (A) according to the invention were synthesized in similar manners to the above.

(2) Acid Generator

Synthesis of Acid Generator (b-1):

$AgBF_4$ in an amount of 16.4 g was mixed with 150 ml of acetonitrile. Thereto, a solution containing 16.0 g of phenacyl bromide and 14 g of methylphenyl sulfide in 50 ml of acetonitrile was added over a period of 30 minutes. The resulting admixture was stirred for one night at room temperature. The reaction solution obtained was concentrated to yield a powder. This powder was washed with diisopropyl ether to yield 26 g of phenacylmethylphenylsulfonium tetrafluoroborate.

A 10 g portion of the phenacylmethylphenylsulfonium tetrafluoroborate was dissolved in 200 ml of methanol, admixed with 5 g of potassium trifluoromethanesulfonate, and stirred for 1 hour at room temperature. The reaction solution thus prepared was admixed with 500 ml of chloroform, and washed with two 300 ml portions of distilled water. The organic layer was concentrated to yield 8 g of Acid Generator (b-1).

Other compounds used as Compound (B) were also synthesized in similar manner to the above.

2. Examples

Example 1

(1) Preparation and Coating of Positive Resist Solution:

| | |
|---|---|
| Acid-decomposable Polymer (B-21) (Component (A)) | 0.937 g |
| Acid Generator (b-1) (Component (B)) | 0.06 g |
| Nitrogen-containing basic Compound D-1 | 0.003 g |

The composition described above was dissolved in 8.5 g of propylene glycolmonomethyl ether acetate, admixed with 0.001 g of Megafac F176 (referred to as "W-1" hereinafter, a surfactant produced by Dai-Nippon Ink & Chemicals, Inc.), and made into a solution. This solution was finely filtered with a membrane filter having a 0.1-μm pore diameter to prepare a resist solution.

The resist solution thus obtained was coated on a 6-inch wafer with a spin coater, Mark 8 (made by TOKYO ELECTRON LIMITED), and dried on a 110° C. hot plate for 90 seconds to form a 0.30 μm-thick resist film.

(2) Formation of Positive Resist Patterns:

The resist film formed in the aforementioned manner was irradiated with an electron-beam drawing apparatus HL750 (acceleration voltage: 50 KeV, made by Hitachi, Ltd.). After irradiation, the resist film was heated on a 110° C. hot plate for 90 seconds, dipped in a 2.38 weight % aqueous solution of tetramethylammoniumhydroxide for 60 seconds, rinsed with water for 30 seconds, and then dried. The sensitivity, resolution, profile and line edge roughness of the patterns formed were evaluated by the following methods respectively.

(2-1) Sensitivity

Profiles of the patterns formed were observed under a scanning electron microscope (S-4300, made by Hitachi, Ltd.). The sensitivity is defined in terms of the minimum irradiation energy required to resolve 0.15-μm line-and-space (1:1) patterns.

(2-2) Resolution

The limiting resolution (capable of resolving lines and spaces separately) under the exposure providing the sensitivity defined above is taken as the resolution.

(2-3) Pattern Profile

The profile shapes of 0.15-μm line patterns formed under the exposure providing the sensitivity defined above were observed with a scanning electron microscope (S-4300 made by Hitachi, Ltd.), and rated on a 1-to-3 scale, namely as a rectangular, somewhat taper or taper shape.

(2-4) Line Edge Roughness

The line width measurement of a 0.15-μm line pattern formed under the exposure providing the sensitivity defined above was carried out at 30 points arbitrarily chosen from a 50-μm segment of the line pattern in the length direction, and the dispersion in the measured values was evaluated in terms of $3\sigma$.

The evaluation results on the positive resist prepared in Example 1 were all good, and more specifically, the sensitivity was 5.0 μC/cm$^2$, the resolution was 0.10 μm, the pattern profile was rectangular, and the line edge roughness was 5.8 nm.

Examples 2 to 15

Resist compositions were prepared, coated, irradiated with electron beams, and subjected to evaluations in the same manners as in Example 1, except that the ingredients set forth in Table 1 were used.

Comparative Example 1

A resist composition was prepared, coated, irradiated with electron beams, and subjected to evaluations in the same manner as in Example 1, except that Acid Generator (B'-1) containing no aryl groups in $Y_1$ and $Y_2$ of formula (I) was used in place of the present acid generator of Component (B).

Comparative Example 2

A resist composition was prepared, coated, irradiated with electron beams, and subjected to evaluations in the same manner as in Example 1, except that Acid Generator (z1) having no phenacyl structure was used in place of the present acid generator of Component (B).

The resist compositions prepared in Examples 1 to 15 and Comparative Examples 1 and 2 are set forth in Table 1, and evaluation results thereof are shown in Table 2.

TABLE 1

| | Component (A) Polymer | Component (B) Acid Generator | Other Acid Generator | Component (D) Nitrogen-containing Basic Compound |
|---|---|---|---|---|
| Example | | | | |
| 1 | B-21 0.937 g Mw = 7500 x/y = 60/40 Mw/Mn = 1.20 | b-1 0.06 g | — | D-1 0.003 g |
| 2 | B-4 0.937 g Mw = 8000 x/y = 40/60 Mw/Mn = 1.15 | b-20 0.06 g | — | D-1 0.003 g |
| 3 | B-21 0.927 g Mw = 8000 x/y = 50/50 Mw/Mn = 1.35 | b-3 0.02 g | z1 0.05 g | D-1 0.003 g |
| 4 | B-38 0.907 g Mw = 12000 x/y/z = 60/20/20 Mw/Mn = 1.10 | b-4 0.09 g | z4 0.03 g | D-1 0.003 g |
| 5 | B-2 0.877 g Mw = 8000 x/y = 45/55 Mw/Mn = 1.30 | b-5 0.10 g | z10 0.02 g | D-1 0.003 g |
| 6 | B-5 0.927 g Mw = 5000 x/y = 40/60 Mw/Mn = 1.10 | b-7 0.04 g | z10 0.02 g z22 0.01 g | D-1 0.003 g |
| 7 | B-10 0.917 g Mw = 8000 x/y = 25/75 Mw/Mn = 1.20 | b-8 0.05 g | z11 0.03 g | D-1 0.003 g |
| 8 | B-14 0.947 g Mw = 8000 x/y/z = 40/50/10 Mw/Mn = 1.15 | b-11 0.01 g | z3 0.03 g z26 0.01 g | D-1 0.003 g |
| 9 | B-22 0.877 g Mw = 8000 x/y = 28/72 Mw/Mn = 1.05 | b-12 0.12 g | — | D-1 0.003 g |
| 10 | B-25 0.917 g Mw = 18500 x/y = 40/60 Mw/Mn = 1.75 | b-13 0.05 g | z2 0.02 g z29 0.01 g | D-1 0.003 g |
| 11 | B-40 0.957 g Mw = 8000 x/y = 80/20 Mw/Mn = 1.20 | b-14 0.04 g | — | D-2 0.003 g |
| 12 | B-26 0.927 g Mw = 8000 x/y/z = 10/50/40 Mw/Mn = 1.15 | b-15 0.06 g | z15 0.01 g | D-2 0.003 g |
| 13 | B-32 0.897 g Mw = 8000 x/y = 80/20 Mw/Mn = 1.10 | b-17 0.04 g | z4 0.04 g z26 0.02 g | D-2 0.003 g |
| 14 | B-29 0.907 g Mw = 2500 x/y = 75/25 Mw/Mn = 1.15 | b-11 0.09 g | — | D-2 0.003 g |
| 15 | B-37 0.907 g Mw = 15000 x/y/z = 30/50/20 Mw/Mn = 1.40 | b-16 0.04 g | z25 0.05 g | D-2 0.003 g |
| Comparative Example 1 | B-21 0.937 g Mw = 7500 x/y = 60/40 Mw/Mn = 1.20 | — | B'-1 0.06 g | D-1 0.003 g |
| Comparative Example 2 | B-21 0.937 g Mw = 7500 x/y = 60/40 Mw/Mn = 1.20 | — | z1 0.06 g | D-1 0.003 g |

The symbols given to the nitrogen-containing basic compounds in Table 1 stand for the following compounds respectively.

D-1: Tri-n-hexylamine

D-2: 2,4,5-Triphenylimidazole

The structure of Acid Generator (B'-1) used in Comparative Example 1 is illustrated below:

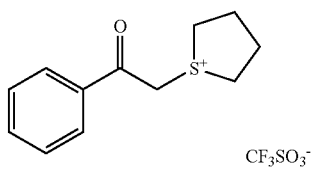

The evaluation results are shown in Table 2.

TABLE 2

| | Sensitivity (μC/cm$^2$) | Resolution (μm) | Pattern Profile Evaluation on 1-to-3 Scale | Line Edge Roughness (nm) |
|---|---|---|---|---|
| Example | | | | |
| 1 | 5.0 | 0.10 | rectangular | 5.8 |
| 2 | 5.5 | 0.10 | rectangular | 4.9 |
| 3 | 5.2 | 0.09 | rectangular | 5.0 |
| 4 | 4.0 | 0.11 | rectangular | 6.0 |
| 5 | 3.8 | 0.12 | somewhat taper | 6.2 |
| 6 | 4.9 | 0.10 | rectangular | 4.5 |
| 7 | 5.6 | 0.11 | rectangular | 4.8 |
| 8 | 5.4 | 0.10 | rectangular | 5.0 |
| 9 | 4.0 | 0.11 | somewhat taper | 6.1 |
| 10 | 5.1 | 0.10 | rectangular | 4.7 |
| 11 | 5.0 | 0.11 | rectangular | 5.3 |
| 12 | 5.3 | 0.09 | rectangular | 5.2 |

TABLE 2-continued

| | Sensitivity ($\mu C/cm^2$) | Resolution ($\mu m$) | Pattern Profile Evaluation on 1-to-3 Scale | Line Edge Roughness (nm) |
|---|---|---|---|---|
| 13 | 5.7 | 0.09 | rectangular | 4.5 |
| 14 | 4.2 | 0.11 | rectangular | 5.8 |
| 15 | 4.5 | 0.10 | rectangular | 5.5 |
| Comparative Example 1 | 7.5 | 0.15 | taper | 7.5 |
| Comparative Example 2 | 8.0 | 0.13 | somewhat taper | 11.0 |

Example 16

A positive resist composition was prepared and coated in the same manners as in Example 1, except that the compounds set forth in Table 3 were used.

Formation of Positive Resist Patterns:

This resist coating was subjected to pattern exposure with a KrF excimer stepper (FPA3000EX-5, made by Canon Inc., wavelength: 248 nm). After the exposure, the same treatments as in Example 1 were performed. Evaluations of the patterns thus formed were made as follows:

(2-6) Sensitivity

Profiles of the patterns formed were observed under a scanning electron microscope (S-4300, made by Hitachi, Ltd.). The sensitivity is defined in terms of the exposure of KrF excimer laser required to resolve 0.18-$\mu m$ line-and-space (1:1) patterns.

(2-7) Resolution

The limiting resolution (capable of resolving lines and spaces separately) under the exposure providing the sensitivity defined above is taken as the resolution.

(2-7) Pattern Profile

The profile shapes of 0.18-$\mu m$ line patterns formed under the exposure providing the sensitivity defined above were observed with a scanning electron microscope (S-4300 made by Hitachi, Ltd.), and rated on a 1-to-3 scale, namely as a rectangular, somewhat taper or taper shape.

(2-8) Line Edge Roughness

The line width measurement of a 0.18-$\mu m$ line pattern formed under the exposure providing the sensitivity defined above was carried out at 30 points arbitrarily chosen from a 50-$\mu m$ segment of the line pattern in the length direction, and the dispersion in the measured values was evaluated in terms of 3$\sigma$.

The evaluation results on the positive resist prepared in Example 16 were all good, and more specifically, the sensitivity was 25 $mJ/cm^2$, the resolution was 0.14 $\mu m$, the pattern profile was rectangular, and the line edge roughness was 5.5 nm.

Examples 17 to 25

Resist compositions prepared by using the compounds set forth in Table 3 were each coated and subjected to exposure evaluation by the KrF excimer laser stepper in the same manners as in Example 16. The evaluation results are shown in Table 4.

Comparative Example 3

A resist composition was prepared, coated, and subjected to KrF exposure evaluations in the same manner as in Example 16, except that Acid Generator (B'-1) containing no aryl groups in $Y_1$ and $Y_2$ of formula (I) was used in place of the present acid generator of Component (B). The resist composition and the evaluation results are shown in Table 3 and Table 4, respectively.

Comparative Example 4

A resist composition was prepared, coated, and subjected to KrF exposure evaluations in the same manner as in Example 16, except that Acid Generator (z4) having no phenacyl structure was used in place of the present acid generator of Component (B). The resist composition and the evaluation results are shown in Table 3 and Table 4, respectively.

TABLE 3

| | Component (A) Polymer | Component (B) Acid Generator | Other Acid Generator | Component (D) Nitrogen-containing Basic Compound |
|---|---|---|---|---|
| Example | | | | |
| 16 | B-21 0.947 g Mw = 7500 x/y = 60/40 Mw/Mn = 1.20 | b-1 0.05 g | — | D-1 0.003 g |
| 17 | B-10 0.937 g Mw = 8000 x/y = 35/65 Mw/Mn = 1.50 | b-20 0.05 g | z11 0.01 g | D-1 0.003 g |
| 18 | B-39 0.947 g Mw = 8000 x/y = 70/30 Mw/Mn = 1.10 | b-3 0.02 g | z1 0.03 g | D-2 0.003 g |
| 19 | B-14 0.947 g Mw = 15000 x/y/z = 30/50/20 Mw/Mn = 1.10 | b-20 0.03 g | z4 0.02 g | D-2 0.003 g |
| 20 | B-22 0.927 g Mw = 8000 x/y = 50/50 Mw/Mn = 1.20 | b-5 0.07 g | — | D-2 0.003 g |

TABLE 3-continued

|   | Component (A) Polymer | Component (B) Acid Generator | Other Acid Generator | Component (D) Nitrogen-containing Basic Compound |
|---|---|---|---|---|
| 21 | B-5 0.937 g Mw = 5000 x/y = 40/60 Mw/Mn = 1.20 | b-7 0.04 g | z10 0.01 g z22 0.01 g | D-2 0.003 g |
| 22 | B-37 0.947 g Mw = 6800 x/y/z = 20/60/20 Mw/Mn = 1.38 | b-8 0.05 g | — | D-1 0.003 g |
| 23 | B-4 0.947 g Mw = 8000 x/y = 50/50 Mw/Mn = 1.20 | b-9 0.01 g | z3 0.03 g z26 0.01 g | D-1 0.003 g |
| 24 | B-2 0.947 g Mw = 15000 x/y = 60/40 Mw/Mn = 1.20 | b-12 0.5 g | — | D-1 0.003 g |
| 25 | B-32 0.947 g Mw = 2500 x/y = 75/25 Mw/Mn = 1.05 | b-13 0.02 g | z26 0.03 g | D-1 0.003 g |
| Comparative Example 3 | B-21 0.947 g Mw = 7500 x/y = 60/40 Mw/Mn = 1.20 | — | B'-1 0.05 g | D-1 0.003 g |
| Comparative Example 4 | B-21 0.947 g Mw = 7500 x/y = 60/40 Mw/Mn = 1.20 | — | z4 0.05 g | D-1 0.003 g |

TABLE 4

|  | Sensitivity (mJ/cm$^2$) | Resolution (μm) | Pattern Profile Evaluation on 1-to-3 Scale | Line Edge Roughness (nm) |
|---|---|---|---|---|
| Example |  |  |  |  |
| 16 | 25 | 0.14 | rectangular | 5.5 |
| 17 | 20 | 0.13 | rectangular | 6.2 |
| 18 | 28 | 0.14 | rectangular | 4.8 |
| 19 | 24 | 0.15 | rectangular | 4.5 |
| 20 | 22 | 0.14 | rectangular | 6.0 |
| 21 | 30 | 0.14 | rectangular | 5.3 |
| 22 | 27 | 0.13 | somewhat taper | 6.1 |
| 23 | 25 | 0.14 | rectangular | 5.9 |
| 24 | 24 | 0.15 | rectangular | 4.7 |
| 25 | 25 | 0.14 | rectangular | 5.4 |
| Comparative Example 3 | 26 | 0.18 | taper | 8.5 |
| Comparative Example 4 | 32 | 0.17 | somewhat taper | 12.0 |

<<Patterning by X-ray irradiation>>

Example 26 and Comparative Examples 5 and 6

Resist coatings were formed by using the same resist compositions as in Example 1, Comparative Example 1 and Comparative Example 2, respectively in accordance with the same method as in Example 1. Then, each resist coating underwent the same patterning operations as in Example 1, except that a X-ray irradiation apparatus (gap value: 20 nm) was used in place of the electron-beam drawing apparatus, and on the thus formed patterns were performed evaluations of resist properties (sensitivity, resolution, pattern profile and line edge roughness) according to the same methods as in Example 1.

The evaluation results are shown in Table 5.

TABLE 5

|  | Sensitivity (mJ/cm$^2$) | Resolution (μm) | Pattern Profile Evaluation on 1-to-3 Scale | Line Edge Roughness (nm) |
|---|---|---|---|---|
| Example 25 | 90 | 0.10 | rectangular | 7.5 |
| Comparative Example 5 | 130 | 0.14 | taper | 14.0 |
| Comparative Example 6 | 120 | 0.14 | taper | 15.5 |

As can be seen from the results shown in Tables 2, 4 and 5, the present positive resist compositions are superior in sensitivity, resolution, pattern profile and line edge roughness to the comparative compositions. In other words, the present resist compositions have significant improvements in resist properties over the comparative ones.

In patterning by irradiation with high-energy beams, including KrF excimer laser, electron beams, X-rays and ionic beams, positive resist compositions according to the invention can ensure all of high sensitivity, high resolution, excellent pattern profile and satisfactory line edge roughness.

The entire disclosure of each and every foreign patent application: Japanese Patent Application No. 2002-231477, from which the benefit of foreign priority has been claimed in the present application is incorporated herein by reference, as if fully set forth.

What is claimed is:
1. A positive resist composition, comprising:
(A) a phenolic polymer having a property of being insoluble or hardly soluble in an aqueous alkali solution and becoming soluble in an aqueous alkali solution by the action of an acid, in which the phenolic polymer includes a repeating unit containing at least one selected from the group consisting of an acetal-pro- tected phenolic hydroxyl group, a ketal-protected phenolic hydroxyl group, a tertiary ester-protected carboxyl group and a tetrahydropyranyl-protected carboxyl group; and (B) a compound represented by the following formula (I) and capable of generating an acid upon irradiation with one of actinic rays and radiation;

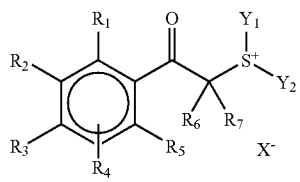

(I)

wherein $R_1$ to $R_5$ each independently represents a hydrogen atom, a nitro group, a halogen atom, an alkyl group, an alkoxy group, an alkyloxycarbonyl group, an aryl group or an acylamino group, and at least two of $R_1$ to $R_5$ may combine to form a ring; $R_6$ and $R_7$ each represents a hydrogen atom; $Y_1$ and $Y_2$ each independently represents an alkyl group, an alkenyl group or an aryl group, $Y_1$ and $Y_2$ may combine to form a ring together with $S^+$, provided that at least one of $Y_1$ and $Y_2$ is an aryl group; at least one of $R_1$ to $R_5$ and at least one of $Y_1$ and $Y_2$ may combine to form a ring; the compound (B) may have at least two structures represented by formula (I) by being combined via a linkage group at any site selected from the group consisting of $R_1$ to $R_5$, $Y_1$ and $Y_2$; and $X^-$ represents an alkanesulfonic acid anion containing at least 3 carbon atoms, a benzenesulfonic acid anion having at least one substituent selected from the group consisting of a halogen atom, a halogen-substituted alkyl group or an alkyl group containing at least two carbon atoms, a naphthalenesulfonic acid anion, an anthracenesulfonic acid anion and a camphorsulfonic acid anion.

2. The positive resist composition as described in claim 1, which further comprises (D) a nitrogen-containing basic compound.

3. The positive resist composition as described claim 1, which further comprises a compound capable of generating an acid upon irradiation with one of actinic rays and radiation, in which the compound is not the compound represented by formula (I).

4. The positive resist composition as described in claim 1, wherein the phenolic polymer (A) represents a phenol resin, a novolak resin, or a polymer containing hydroxystyrene units in the molecule, each of polymers having: a property of being insoluble or hardly soluble in an aqueous alkali solution and becoming soluble in an aqueous alkali solution by the action of an acid; and including a repeating unit containing at least one selected from the group consisting of an acetal-protected phenolic hydroxyl group, a ketal-protected phenolic hydroxyl group, a tertiary ester-protected carboxyl group and a tetrahydropyranyl-protected carboxyl group.

5. The positive resist composition as described in claim 1, wherein the phenolic polymer (A) represents a polymer containing hydroxystyrene units in the molecule, the polymer having: a property of being insoluble or hardly soluble in an aqueous alkali solution and becoming soluble in an aqueous alkali solution by the action of an acid; and including a repeating unit containing at least one selected from the group consisting of an acetal-protected phenolic hydroxyl group, a ketal-protected phenolic hydroxyl group, a tertiary ester-protected carboxyl group and a tetrahydropyranyl-protected carboxyl group.

6. The positive resist composition as described claim 1, which further comprises at least one of a fluorine-containing surfactant, a silicon-containing surfactant and a surfactant containing both fluorine and silicon atoms.

* * * * *